United States Patent [19] [11] 4,020,535
Cuneo et al. [45] May 3, 1977

[54] METHOD OF MAKING AN ELECTRO-DISCHARGE ELECTRODE

[75] Inventors: Edward A. Cuneo, Westminster; Makoto Kato, Santa Ana; Michael S. Wilson, Costa Mesa, all of Calif.

[73] Assignee: Metropolitan Circuits, Inc., Costa Mesa, Calif.

[22] Filed: Aug. 1, 1975

[21] Appl. No.: 601,085

[52] U.S. Cl. .................... 29/25.18; 51/319
[51] Int. Cl.$^2$ ........................ H01J 9/02
[58] Field of Search ........... 29/25.17, 25.18, 629; 51/310, 311, 312, 319, 321

[56] References Cited
UNITED STATES PATENTS

| | | | |
|---|---|---|---|
| 3,535,758 | 10/1970 | Hoet | 29/25.18 |
| 3,819,430 | 6/1974 | Dugan | 29/625 |
| 3,909,930 | 10/1975 | Gurtler | 29/592 |

Primary Examiner—Richard B. Lazarus
Attorney, Agent, or Firm—Jackson & Jones

[57] ABSTRACT

Method of forming an electrode for imprinting or imaging a circuit board mold face includes covering a grahite substrate with a photoresist material. The photoresist material is appropriately exposed to develop a desired pattern. The unpolymerized photoresist is removed from the graphite substrate to leave the desired pattern of an exposed graphite surface. The graphite substrate is then impacted by a dry air blast of glass beads having a size in the range of approximately 200 to 325 mesh. The glass beads will remove a desired amount of graphite to thereby cut the desired pattern into the substrate but will not remove the photoresist or affect the substrate beneath the polymerized photoresist. The polymerized photoresist is removed with materials that will not interfere with the subsequent machining process. The resultant cut graphite substrate can be utilized as a electrode in an electrical discharge machining process to form a desired pattern in a mold face.

12 Claims, 8 Drawing Figures

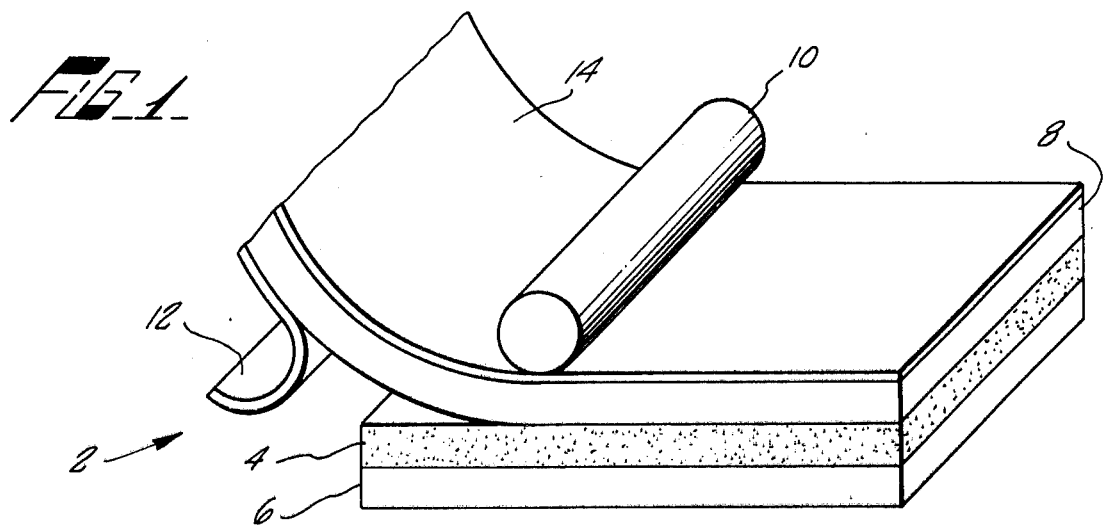
FIG_1.
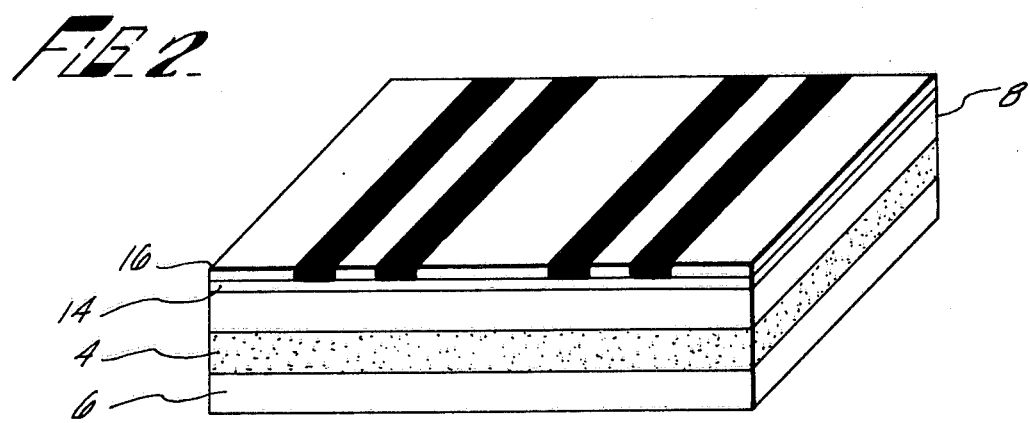
FIG_2.
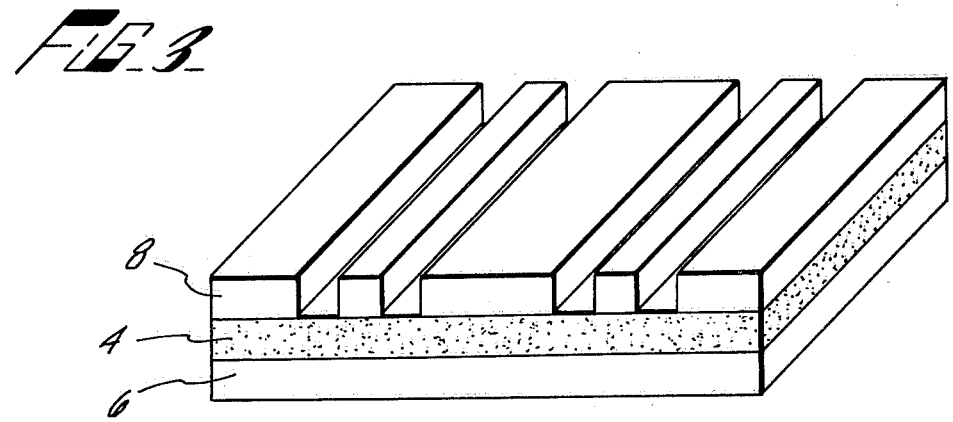
FIG_3.

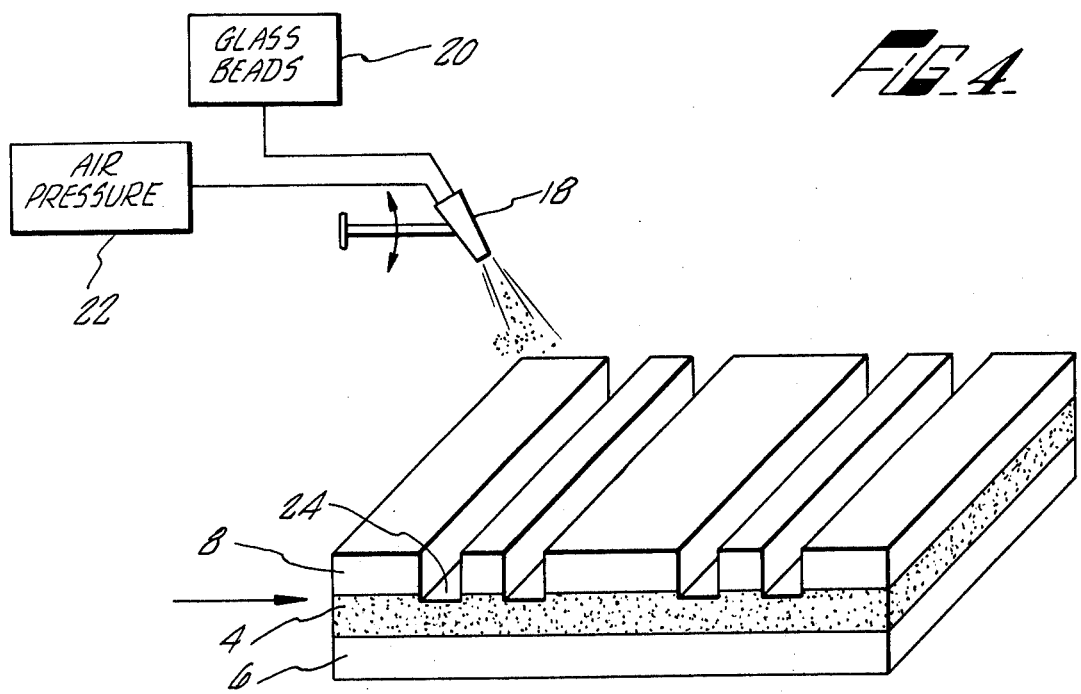
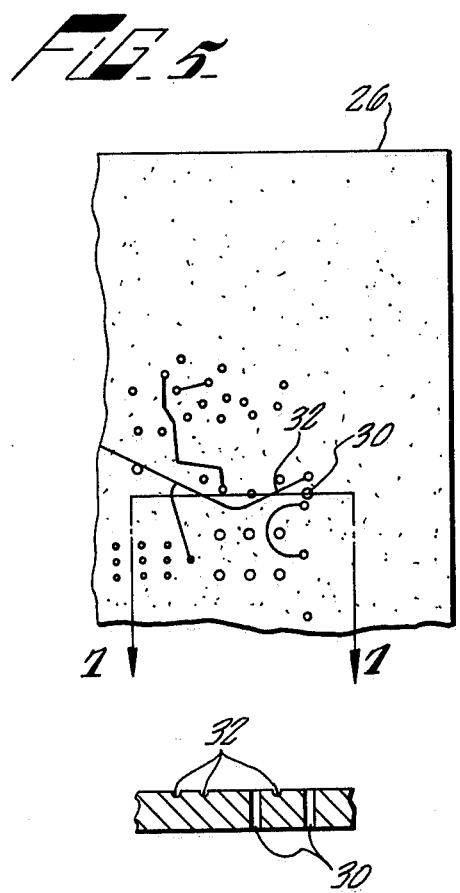
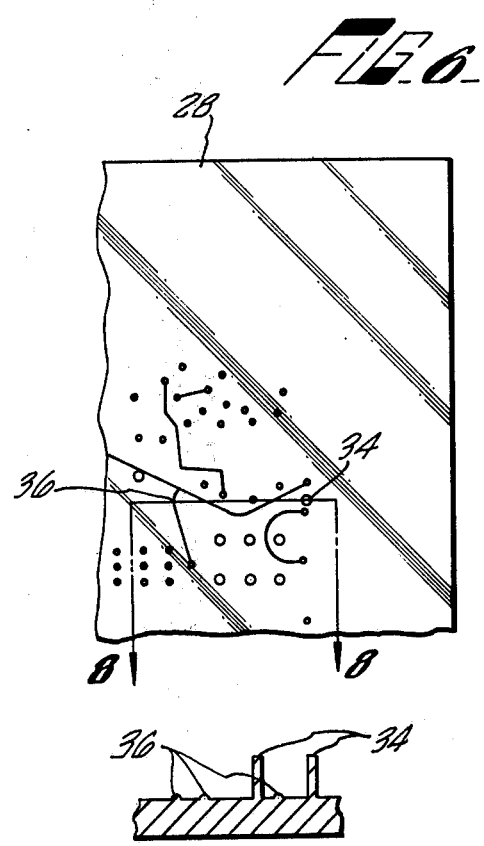

METHOD OF MAKING AN ELECTRO-DISCHARGE ELECTRODE

BACKGROUND OF THE INVENTION

1. Field of the Invention

The present invention is useful in the field of manufacturing printed circuit boards and more particularly in the electrical discharge manufacture of a pattern, such as a mold face for forming plastic circuit board substrates.

2. Brief Description of the Prior Art

A number of different manufacturing methods have been employed in the manufacturing of printed circuit boards. Generally, the modern circuit board has evolved to a dielectric substrate or insulating panel having a surface plated with a conductive material. The desired circuit pattern has been provided by a number of methods such as chemical etching with nitric or other mineral acids, cutting, debossing or molding with a mold face. Various molding methods have been employed including injection molding, transfer molding and mechanical routing. A particularly desirous approach is to form the desired design by etching or milling a steel plate and then utilizing the resultant mold face for forming the insulating panels or substrate of the circuit boards. A method of making a pressure die by sandblasting for a mechanical joining of a foil to a substrate is shown in U.S. Pat. No. 2,925,645.

Broadly, in the field of cutting mold faces, electrical discharge machines have been utilized wherein a highly conductive workpiece and a conductive electrode are attached to opposite terminals. The workpiece and the electrode are brought together for an electro-erosion of the conductive workpiece generally in a dielectric medium. The following U.S. Pat. Nos. 3,469,058 and U.S. Pat. No. 3,167,632, are cited of general interest in this field.

In producing relative intricate mold faces it is frequently necessary to utilize a rough electrode tool for an initial electro-erosion at a relatively high current flow. A subsequent electrode is utilized for a final finishing step of electroerosion at generally lower current flow.

One approach has been to utilize a graphite substrate with a desired pattern cut into the face of the graphite substrate as a roughing tool or electrode. For the finishing step, a copper electrode is generally required to produce an adequate steel mold face. The high labor requirements and cost in producing a steel mold face have limited production of molds by an electrical discharge procedure to those items that can justify the cost. The relatively high cost of producing the steel die requires a significant number of molded items to be produced to amortize the cost and make the end product competitive with other methods of producing the same product.

As mentioned above, steel molds for printed circuit boards are to the best knowledge of the inventors, commercially produced today by etching or various forms of milling or cutting, such as a pantograph copy milling machine disclosed in U.S. Pat. No. 3,886,847. It is not believed that an electrode discharge process has previously been utilized to form mold faces for a printed circuit board.

SUMMARY OF THE INVENTION:

A method of manufacturing a circuit board mold member is provided. The circuit board mold member is utilized in the fabrication of printed circuit board substrates by molding a plastic material with the desired pattern recessed into the substrate.

A conductive substrate, such as graphite is attached to a steel support plate. The substrate, after appropriate preparatory steps, receives a layer of protective material, such as photoresist and is subsequently masked with a desired pattern and exposed to a source of energy, such as ultraviolet radiation. Where struck by the ultraviolet radiation, the photoresist is polymerized and made insoluble in the developer. The preselected pattern or image areas are revealed when unexposed portions are washed away by the developer. The graphite substrate with a surface consisting of exposed areas of both graphite and the polymerized photoresist pattern is then impacted, for example, by a dry air blasting operation with particles, having a dimensional size and velocity capable of eroding away a predetermined depth of substrate in the exposed pattern while not removing the protective photoresist pattern. Spherical glass beads having a dimensional size in the range of 200 to 325 mesh can be advantageously utilized. The impact of the glass beads removes the graphite to the desired depth in the exposed areas to provide a relatively concisely defined pattern of image relief areas in the graphite surface. The spherical glass beads, however, do not significantly remove the photoresist or affect the graphite surface beneath the photoresist. Appropriate solutions are utilized to remove the polymerized photoresist pattern leaving the desired image on the graphite substrate. The graphite substrate can then be utilized as a roughing tool or machining electrode for electrically burning away the imaged areas on the desired steel mold face which will form the circuit board mold. A subsequent finishing copper electrode can be utilized, if necessary, for the final forming step of the steel mold face. Depending on the required image pattern detail, it is possible to provide a finished mold face with the present method without requiring a finishing copper electrode.

The features of the present invention which are believed to be novel are set forth with particularity in the appended claims. The present invention both as its organization and manner of operation, together with further objects and advantages thereof, may be best understood by reference to the following description, taken in conjunction with accompanying drawings.

BRIEF DESCRIPTION OF THE DRAWINGS

FIG. 1 is a perspective view of the application of a photoresist film to the graphite substrate;

FIG. 2 is a perspective view of the exposure of the photoresist through a mask;

FIG. 3 is a perspective view of the developed photoresist image of the graphite substrate;

FIG. 4 is a perspective view of the glass bead impacting steps;

FIG. 5 is a plan view of a portion of a graphite electrode;

FIG. 6 is a plan view of a portion of a steel mold face;

FIG. 7 is a cross sectional view of a portion of FIG. 5; and

FIG. 8 is a cross sectional view of a portion of FIG. 6.

DESCRIPTION OF THE PREFERRED EMBODIMENT

The following specification taken in conjunction with the drawings sets forth the process steps of the present invention in such a manner that any person skilled in the art can utilize the invention. The embodiments of the invention disclosed herein, are the best modes contemplated by the inventors in carrying out their invention in a commerical environment, although it should be understood that various modifications can be accomplished within the parameters of the invention.

Referring to FIG. 1, a substrate blank 2 is disclosed in a perspective view and comprises a conductive substrate 4, such as graphite and a base plate 6, such as steel. The graphite and steel portion can be mechanically or adhesively held together. The substrate 4 is intended to form the imaging surface of an electrode for an electrical discharge machining process in manufacturing a mold face. In the preferred embodiment, a graphite substrate 4 is utilized, however, it would be possible to utilize other conductive substrates or even a dielectric substrate, such as ceramic that could be subsequently coated with a conductive plating metal.

Generally, the base plate 6 will consist of a rectangular steel plate that has been appropriately cleaned and degreased as preparatory steps to the bonding of the graphite substrate 4 to the steel base plate 6. The steel base plate 6 is also electrically conductively attached to the graphite substrate 4. Generally, the substrate blank 2 would be appropriately sized by milling and while not shown tooling holes can be appropriately drilled in the substrate blank 2 for mounting purposes.

The graphite substrate 4 can also be lightly abraded to insure uniformity of surface. The substrate blank 2 can be heated, for example, in an oven, as a preparatory step for receiving an application of a protective material 8, such as a dry film photoresist of the type sold commercially by the Dupont De Nemours & Co. through their RISTON products division. Other resist materials, such as liquid resist or other forms of protective material can be utilized within the parameters of the present invention.

FIG. 1 discloses a pressure application step of the photoresist protective material 8 on the heated substrate blank 2 with the use of a pressure roller 10. A polyolefin separator sheet 12 is removed prior to the application directly onto the graphite surface while a Mylar cover sheet 14 protects the resist 8 from contamination and damage. The heat assists in the application of the protective photoresist 8 to the graphite surface.

While not disclosed, the steel base plate 6 can also be laminated with a photoresist material to provide a mirror image of the desired predetermined circuit image pattern to facilitate machine drilling of the final graphite electrode. After the photoresist protective material 8 is applied to both sides of the substrate blank 2, it is allowed to cool to room temperature.

Referring to FIG. 2 an appropriate art work or mask 16 is respectively aligned on either side of the substrate blank 2 and exposed to a source of energy, such as ultraviolet radiation to develop an image in the photoresist material. The mask 16 will carry the desired predetermined circuit image. Numerous exposure devices are available in the prior art, for example, a collimated high pressure mercury vapor source could be utilized to provide the UV radiation. The mask 16 is removed and the photoresist coated substrate blank 2 is then heated and subsequently allowed to cool to room temperature.

The Mylar protective sheet 14 is removed and the predetermined circuit image is developed, for example in a spray developing chamber wherein a spray pattern of stabilized methyl chloroform can be utilized to wash away the unexposed portions of the protective material 8. As known in the art, the substrate blank 2 can be removed from a developing chamber and agitated in the solvent rinse tank to remove any dissolved resist that could be carried over from the development chamber. If desired, the substrate blank 2 can be rinsed with spray water and either dried with oil free compressed air or racked in a vertical position and allowed to drain dry at room temperature. Referring to FIG. 3, the substrate blank 2 is disclosed with the protective material 8 developed to provide a predetermined pattern of exposed graphite surface.

Referring to FIG. 4, the substrate blank 2 with the developed pattern of protective material 8 is then struck with a plurality of particles having a dimensional size and velocity to erode away a predetermined depth of the graphite substrate 4 in the exposed pattern while at the same time not removing the protective material from the graphite substrate 4. The protective material 8 has been applied with sufficient thickness to maintain at least a sufficient amount of protective material to continually protect the graphite substrate that it covers while at the same time not inhibiting the sharply defined cutting or eroding away of the exposed graphite substrate 4.

As can be seen in FIG. 4, the predetermined pattern or circuit image is cut into the graphite face using a dry air blasting technique with spherical or circuitous glass beads having a dimensional size of approximately 200 to 325 mesh applied at approximately 60 psi of air pressure. The exact amount of air pressure will, of course, be subjective to the relative nozzle size and equipment utilized and satisfactory results have been achieved in the range of 20 psi to 100 psi. The glass beads 20 and air pressure source 22 are connected to the spray nozzle 18 which can be pivotally mounted within a chamber to provide a radial arc spray pattern across the surface of the substrate blank 2 coated with the protective material 8. Either the spray nozzle 18 can move with a translational motion relative to the substrate blank 2 or the substrate blank 2 can be moved, for example, on a carrier plate or belt relative to the spray nozzle 18. In either arrangement, the entire surface of the substrate blank 2 will be sprayed with the glass beads 20. As can be seen from FIG. 4, circuit grooves 24 correspond to roughly 15 mils in depth are created by the impact of the glass beads particles 20 on the exposed graphite substrate.

The use of glass beads 20 having a dimensional size of approximately 200 to 325 mesh is of particular importance in providing both a spherical impact surface and the appropriate mass or weight that will cut the exposed graphite substrate 4 but will not remove enough of the polymerized photoresist material 8 to expose the protective substrate. Experiments with other particle materials, such as sand, has disclosed that they will cut away the photoresist material and accordingly destroy the desired circuit image.

The advantageous use of a photoresist as the protective material for developing the circuit image is of particular importance in permitting a relatively economical manufacturing process of the graphite electrode. As can be readily appreciated by those skilled in the art, the relative cost involved in any process is as significant as any technical limitation on the process. Thus, the cutting of the circuit image into the graphite substrate with the glass beads offers an economical and significant advance in manufacturing a commericially acceptable electrode for an electrical discharge process. While not shown, a photoresist stripper compatible to the protective material 8 is utilized to remove the protective material 8 before using it as an electrode.

Appropriate holes can be drilled through the graphite to accommodate the oil utilized in the electrical discharge machine process for cooling and removing the electro-etched metal or swarf and, more importantly, to provide posts 36 on the steel mold 28. If numerically controlled drilling equipment is available, the graphite can be directly drilled or by utilizing the pattern on the back surface of the steel base plate 6, hand drilling can be accomplished. A finished graphite electrode 26, can be utilized to form either a rough steel mold image face or even a finished mold image face depending on the required detail dimensions as disclosed in FIG. 5. FIG. 7 discloses a cross sectional view, taken along lines 7—7 in FIG. 5, of the graphite electrode 26. The recessed grooves 32 will correspond to the conductive paths on the finished circuit board while the bores 30 will correspond to plated holes in the circuit board.

The steel mold 28, as seen in FIG. 6, can be finished, if required, by a second electrical discharge imaging process with the use of a copper electrode. FIG. 8 discloses a cross sectional view, taken along lines 8—8 in FIG. 6, of the steel mold 28. The raised pattern 36 will form the recessed grooves on the circuit board substrate for the conductive material, while the posts 34 will provide appropriate holes in the substrate. A copper substrate plate (not shown) has appropriately tooling holes drilled therein and is cleaned to remove any oils or greases. The copper substrate is oven dried and laminated with a photoresist film. After the photoresist film is cooled to room temperature, an appropriate art work or mask is attached and exposed, for example, on a Conex machine. The Mylar protective sheet is removed from the photoresist material and a developer spray bath can be utilized to develop the image. The copper substrate with the photoresist image is then dried and ferric chloride can be used to etch the exposed copper to a depth of approximately 8 mils. A numerically controlled drilling machine can be utilized to drill all the holes and then the photoresist can be appropriately stripped to provide the finishing copper electrode tool for the final electrical discharge imaging process of the steel mold face 26.

An alternative method of abrading a desired circuit image on relatively small surface areas, 12 square inches and less, having a predetermined depth into the graphite substrate (not shown) is to utilize a plastic master die preferably having an abrasive image surface projecting from the master surface. The plastic resin would be repetitively impacted, for example, with an ultrasonic transducer to gradually abrade the determined depth into the anvil or support surface while the master would be the applicator of the vertical oscillatory motion.

As can be appreciated, this approach will have the advantage of not requiring a protective material but, however, would require the production of a plastic master die with a sufficiently abrasive surface.

The method of making a electro-discharge electrode is highly advantageous in the field of manufacturing printed circuit boards, but the present invention can be utilized to manufacture mold faces for other products.

As can be readily appreciated, it is possible to deviate from the above embodiments of the present invention and as will be readily understood by those skilled in the art the invention is capable of many modifications and improvements within the scope and spirit thereof. Accordingly, it will be understood that the invention is not to be limited by the specific disclosed embodiment but only by the scope and spirit of the appended claims.

We claim:

1. In a method for forming an electrical discharge machine electrode tool the improvement comprising:
   covering a graphite substrate with a predetermined pattern of protective material to form a desired exposed pattern of substrate surface;
   striking graphite the substrate surface with a plurality of spherical glass bead particles having a dimensional size in the range of 200 to 325 mesh and a driven velocity from a pressure range of 20 to 100 psi to erode away a groove pattern of a predetermined depth of substrate in the exposed pattern while not removing the substrate under the protective material, and
   removing the protective material.

2. The method of claim 1 wherein the protective material is polymerized photoresist adhered to the substrate surface.

3. The method of claim 1 wherein the glass beads are further driven at a velocity provided by an air blast in the pressure range of 20 to 100 psi.

4. A method of forming an electrode tool for use in an electrical discharge machining process during the formation of a circuit board mold member, comprising the steps of:
   a. covering a graphite substrate with a coating of protective material;
   b. masking the protective material with a predetermined circuit design image;
   c. exposing the protective material through the masking image to a source of energy to polymerize the exposed protective material;
   d. removing a portion of the protective material to provide a desired exposed pattern of substrate surface;
   e. impacting the substrate with a plurality of glass beads having a dimensional size in the approximate range of 200 to 325 mesh to cut a desired image groove depth into the exposed substrate surface; and
   f. removing the remaining protective material to provide a electrode tool face with a circuit design image.

5. The method of claim 4 wherein the graphite is covered with a strip of dry film photoresist as the protective material.

6. The method of claim 4 further including the step of attaching the graphite substrate to a support plate.

7. The method of claim 4 further including the step of drilling holes through the graphite substrate to permit the flow of fluid during the electrical discharge imaging process and provide posts on the mold member.

8. A method of forming an electrode tool for use in an electrical discharge machining process during the formation of a circuit board mold member, comprising the steps of:

a. covering a graphite substrate with a coating of photoresist material;

b. masking the photoresist material with a predetermined circuit design image;

c. developing the photoresist material through the circuit design masking image with a source of energy to polymerize the exposed photoresist material;

d. removing a portion of the photoresist material to provide a circuit design pattern of only the graphite substrate surface;

e. impacting the substrate with a plurality of glass beads having a dimensional size in the approximate range of 200 to 325 mesh to cut only a circuit design groove pattern into the exposed graphite substrate surface;

f. drilling holes through the graphite substrate to permit the formation of posts on the mold member during an electrical discharge imaging process, and g. removing the remaining photoresist material to provide an electrical discharge machine electrode tool face with a grooved circuit design image.

9. The method of claim 8 wherein the circuit design groove pattern is cut in the approximate range of 15 mils depth into the graphite substrate surface.

10. The method of claim 9 wherein the graphite substrate has a rectangular configuration and the glass beads are impacted by a spray nozzle ejecting the glass beads with a translational motion relative to the surface of the graphite substrate.

11. The method of claim 1 wherein the groove depth is cut in the approximate range of 15 mils depth into the graphite substrate surface.

12. The method of claim 4 wherein the groove depth is cut in the approximate range of 15 mils depth into the graphite substrate surface.

* * * * *

UNITED STATES PATENT AND TRADEMARK OFFICE
CERTIFICATE OF CORRECTION

PATENT NO. : 4,020,535

DATED : May 3, 1977

INVENTOR(S) : Edward A. Cuneo et al

It is certified that error appears in the above-identified patent and that said Letters Patent are hereby corrected as shown below:

In Claim 1: Column 6, line 19 after striking delete "graphite the" and insert --the graphite--.

Signed and Sealed this nineteenth Day of July 1977

[SEAL]

Attest:

RUTH C. MASON
*Attesting Officer*

C. MARSHALL DANN
*Commissioner of Patents and Trademarks*